(12) United States Patent
Schmid et al.

(10) Patent No.: US 7,417,247 B2
(45) Date of Patent: Aug. 26, 2008

(54) PENTAARYLCYCLOPENTADIENYL UNITS AS ACTIVE UNITS IN RESISTIVE MEMORY ELEMENTS

(75) Inventors: Günter Schmid, Hemhofen (DE); Hagen Klauk, Erlangen (DE); Marcus Halik, Erlangen (DE); Reimund Engl, Nürnberg (DE); Andreas Walter, Egloffstein (DE)

(73) Assignee: Infineon Technologies, AG, Neubiberg (DE)

(*) Notice: Subject to any disclaimer, the term of this patent is extended or adjusted under 35 U.S.C. 154(b) by 219 days.

(21) Appl. No.: 11/092,968

(22) Filed: Mar. 30, 2005

(65) Prior Publication Data
US 2005/0213413 A1 Sep. 29, 2005

Related U.S. Application Data

(63) Continuation of application No. PCT/DE03/02994, filed on Sep. 9, 2003.

(30) Foreign Application Priority Data

Sep. 30, 2002 (DE) .................. 102 45 539

(51) Int. Cl.
*H01L 51/30* (2006.01)
*C08F 8/02* (2006.01)

(52) U.S. Cl. .......... 257/40; 257/E51.027; 257/E51.036; 365/153

(58) Field of Classification Search .......... 257/40, 257/E51.027, E51.036, E51.037; 438/82, 438/99; 365/151, 153; 525/338–339; 554/27; 552/502; 585/354
See application file for complete search history.

(56) References Cited

U.S. PATENT DOCUMENTS

| | | | | | |
|---|---|---|---|---|---|
| 5,811,833 | A | * | 9/1998 | Thompson | 257/40 |
| 5,922,396 | A | * | 7/1999 | Thompson | 427/69 |
| 5,962,359 | A | * | 10/1999 | Aulbach et al. | 502/103 |
| 6,114,463 | A | | 9/2000 | Chen et al. | |
| 6,586,268 | B1 | * | 7/2003 | Kopola et al. | 438/22 |

FOREIGN PATENT DOCUMENTS

| | | |
|---|---|---|
| GB | 1009361 | 11/1965 |
| JP | 3-37991 A | 2/1991 |
| JP | 2000053599 A * | 2/2000 |
| WO | WO 98/28767 A1 | 7/1998 |

OTHER PUBLICATIONS

A Bune et al., "*Novel switching phenomena in ferroelectric Langmui-Blodgett films*", Appl. Phys. Lett. 67 (26) (1995) pp. 3975-3977.

(Continued)

*Primary Examiner*—Bradley W. Baumeister
*Assistant Examiner*—Matthew W Such
(74) *Attorney, Agent, or Firm*—Edell, Shapiro & Finnan, LLC

(57) ABSTRACT

Polymers are described which exhibit a resistive hysteresis effect. The polymers include a polymer backbone to which pentaarylcyclopentadienyl radicals are bonded as side groups. A resistive memory element is formed that includes the polymer as a storage medium. By applying a voltage, the memory element can be switched between a nonconductive and a conductive state.

15 Claims, 7 Drawing Sheets

OTHER PUBLICATIONS

A. Bune et al., "*Two-dimensional ferroelectric films*" Nature 391 (1998), pp. 874-877.

Gao, H. J. et al., "*Reversible, Nanometer-Scale Conductance Transitions in an Organic Complex*," Phys. Rev. Lett., 84 (2000), pp. 1780-1783.

Krieger H. Ju. et al., "*Molecular Analogue Memory Cell Based on Electrical Switching and Memory in Molecular Thin Films*" Syn. Met. 122 (2001), pp. 199-202.

Ma. D. et al., "*Organic Reversible Switching Devices for Memory Applications*" Adv. Mater. 12 (14) (2000), pp. 1063-1066.

K. Ziegler, B. Schnell, Liebigs Ann. Chem. 445 (1925), pp. 266-282.

W. Dilthey, O. Trösken, K. Plum, W. Schommer, J. Prakt. Chem. 141 (1934), pp. 331-349.

S. B. Coan, D. E. Trucker, E. I. Becker, "*The Absorption Spectra of Tetracyclones*" J. Amer. Chem. Soc. 77 (1955), pp. 60-77.

L. D. Field, "*Preparation and Characterization of Iron Complexes of the Penta-o-tolylcyclopentadienyl and o-Tolyltetraphenylcyclopentadienyl Ligads*" Inorg. Chem. 32 (1993), pp. 211-217.

Organikum 18$^{th}$ edition (1990), pp. 457.

R. Stierlein, Chem. Ber. 22/1 (1889), pp. 376-383.

Braun, D. et al.; "New Hydrazyls of Low Molecular Weight and Polymeric Hydrazyls"; Angew. Chem. internat.Edit., vol. 7 (1968), No. 12; pp. 945-946.

Braun, D. et al.; "Stabile of Polykohlenstoffradikale, 1"; Makromol. Chem. 177 (1976); pp. 1373-1386 (with English Summary).

Database WPO Section E1, Week 199113 Derwent Publications Ltd., London, GB; AN 1991-091907 (XP002270985); 1 page.

\* cited by examiner

Simulation 0.5 mT

WAVE NUMBER [ 1/cm ]

WAVE NUMBER [ 1/cm ]

PENTAARYLCYCLOPENTADIENYL UNITS AS ACTIVE UNITS IN RESISTIVE MEMORY ELEMENTS

CROSS REFERENCE TO RELATED APPLICATIONS

This application is a continuation of PCT/DE03/02994 filed Sep. 9, 2003, and titled "Pentaarylcyclopentadienyl Units as Active Units in Resistive Memory Elements," which claims priority under 35 U.S.C. §119 to German Application No. DE 102 45 539.2, filed on Sep. 30, 2002, and titled "Pentaarylcyclopentadienyl Units as Active Units in Resistive Memory Elements," the entire contents of which are hereby incorporated by reference.

FIELD OF THE INVENTION

The invention relates to a polymer having semiconductor properties and a resistive memory cell.

BACKGROUND

Semiconductor chips are widely used in a variety of industrial applications. They are generally based on silicon as a semiconductor substrate into which semiconductor components are integrated in numerous operations. The production of semiconductor chips is therefore complicated and expensive. The discovery of electrically conductive organic compounds has opened the path to microelectronic components, which are no longer based on inorganic semiconductor materials but on synthetically obtainable organic polymers. Owing to the variability of their structure, these compounds permit the development of materials which are optimized especially for a specific application. Many microelectronic components, such as light emitting diodes or transistors, which demonstrate the suitability of these organic materials for the production of highly integrated circuits, have also already been developed. Some of these components, such as, for example, light emitting diodes, have already reached such a high level of development that industrial production appears possible. However, the material development for volatile or nonvolatile memories based on organic polymers and molecules is still substantially at the research stage. In *A. Bune et al., Appl. Phys. Lett.* 67 (26) (1995) 3975, and *A. Bune et al., Nature* 391 (1998) 874, it was shown that materials based on PVDF (polyvinylidene difluoride), in particular a copolymer with trifluoroethylene (PVDF-PTrFE; 70:30), are suitable as materials for memory applications with medium to low density. The ferroelectricity of these materials is utilized for use as a storage medium.

To be able to achieve higher storage densities, the size of the individual memory elements has to be correspondingly reduced. In the case of a size of the structural elements of less than 100 nm, memories which are based on a change in the electrical resistance are preferred to memories based on ferroelectricity, since this can be more easily evaluated by means of an electrical technology. In Gao, H. J et al., *Phys. Rev. Lett.* 84 (2000) 1780-1783, a memory concept is described which is based on a donor-acceptor complex of 1,4-phenylenediamine and 3-nitrobenzalmalononitrile. For the storage information, the difference between the electrical conductivities of amorphous and crystalline phase is utilized. In Krieger H. Ju. et al., *Syn. Met.* 122 (2001) 199-202, a concept for the production of memories based on organic materials is described, in which the doping and dedoping of an organic $\pi$-conjugated semiconductor by salt additives is utilized in order to effect a change in the conductivity of layers. In Ma D. et al., *Adv. Mater.* 12(14) (2000) 1063-1066, a resistive memory element is described that includes (as a storage medium) a polymethacrylate derivative carrying anthracene side groups. The poly(methyl methacrylate-co-9-anthracenylmethyl methacrylate) exhibits a resistive hysteresis effect. On application of a voltage, the component exhibits electrical conductivity above a critical voltage ($V_{crit.}$). If the applied voltage is then decreased again, the component remains electrically conductive until the voltage falls below a threshold voltage $V_{hold}$, below which the component returns to its nonconductive state.

At present, no memory elements based on organic materials are as yet available which make industrial production appear promising.

SUMMARY OF THE INVENTION

It is therefore an object of the invention to provide novel polymers having interesting electrical properties.

This and other objects are achieved with a polymer having semiconductor properties, where the polymer comprises a polymer backbone and pentaarylcyclopenta-1,3-dienyl radicals bonded as side groups to the polymer backbone.

In another embodiment of the present invention, a resistive memory element comprises a memory cell that includes at least one actuatable first contact, one second contact and one storage medium arranged between first and second contacts, the storage medium being formed from the polymer described above.

The above and still further objects, features and advantages of the present invention will become apparent upon consideration of the following definitions, descriptions and descriptive figures of specific embodiments thereof. While these descriptions go into specific details of the invention, it should be understood that variations may and do exist and would be apparent to those skilled in the art based on the descriptions herein.

DETAILED DESCRIPTION

Figure 1A:
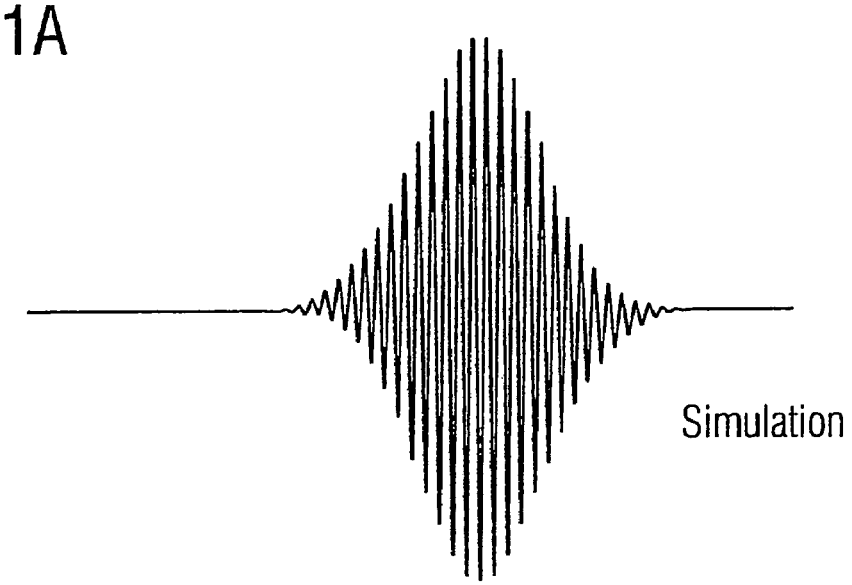
FIGS. 1A and 1B depict an electron spin resonance spectrum of the pentaphenylcyclopentadienyl radical of the present invention.

In accordance with the present invention, a polymer is provided that includes semiconductor properties, where the polymer includes a polymer backbone and pentaarylcyclopenta-1,3-dienyl radicals bonded as side groups to the polymer backbone.

The cyclopentadienyl radical can be easily oxidized, a radical cation which can become stable by elimination of a proton being produced. The aryl radical bonded to the central cyclopentadienyl group results in the formation of an extensive delocalized π-electron system in which the individual electron can be delocalized, with the result that the radical acquires high stability. By taking up an electron, the cyclopentadienyl radical can reversibly revert to the starting state after addition of a proton. The polymer according to the invention can therefore accept holes (or donate electrons) and stabilize the holes in the polymer.

The pentaarylcyclopentadienyl radicals are bonded as side groups to the backbone of the polymer. The term "polymer backbone" is defined as the main chain of the polymer. This serves primarily for the mechanical stability of the polymer, by means of which the pentaarylcyclopentadienyl radicals can be arranged in a certain order relative to one another. The polymer backbone can therefore include a wide variety of different structures. All known polymer classes are suitable for forming the polymer backbone. Examples include, without limitation, polyvinyls, polyesters, polycarbonates, polyamides and polyurethanes. The pentaarylcyclopentadienyl radicals are bonded to the polymer main chain via suitable groups, in the simplest case via a single bond. The binding to the polymer backbone takes place via one of the aryl groups, which carries a suitable group for this purpose. The group provided on the aryl group is selected so as to match those groups which are present on the polymer backbone. If the polymer backbone is formed, for example, by a polyacrylate, the aryl group may have, for example, a hydroxyl group or an amino group so that the pentaarylcyclopentadienyl radical is bonded to the polymer backbone via an ester bond or an amide bond. As a result of copolymerization of correspondingly functionalized pentaarylcyclopenta-1,3-dienes, which include a corresponding polymerizable carbon-carbon double bond for this purpose, the pentaarylcyclopentadienyl radical can be bonded to the polymer backbone via a carbon-carbon bond or, if a corresponding (meth)acrylate is used, via an ester bond.

The aryl radicals bonded to the central cyclopenta-1,3-dienyl radical are chosen so that as large a delocalized π-electron system as possible can be produced. The aryl radical may be identical or different and in each case include one or more aromatic ring systems.

The central cyclopenta-1,3-dienyl radical is preferably substituted by phenyl groups, which in turn may be mono- or polysubstituted by further groups, in particular alkyl groups. The pentaarylcyclopenta-1,3-dienyl radical preferably has a structure of the following formula I:

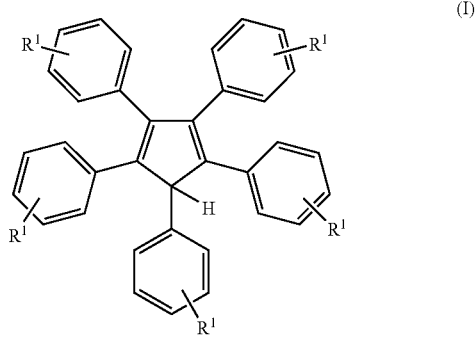

(I)

in which $R^1$, which can be the same or different at each position, is independently selected from a hydrogen atom, a halogen atom (e.g., fluorine, chlorine or bromine), an alkyl group including 1 to 10 carbon atoms, an alkoxy group including 1 to 10 carbon atoms (e.g., a methoxy group or an ethoxy group) and an aryl group including 5 to 20 carbon atoms, where the aryl group can be mono- or polysubstituted (e.g., substituted with an alkyl group including 1 to 10 carbon atoms, an alkoxy group including 1 to 10 carbon atoms or a halogen).

$R^1$ may be arranged in the m- or p-position relative to the bond to the central cyclopentadienyl radical, the p-position being preferred. One of the phenyl rings of the cyclopentadienyl radical of the formula I which is bonded to the central cyclopentadiene ring carries a group via which the pentaarylcyclopenta-1,3-dienyl radical is bonded as a side group to the polymer backbone. In the simplest case, this group is a single bond. The group for linking the pentaphenylcyclopenta-1,3-dienyl radical to the polymer backbone may be varied within wide limits and, as already described above, depends on the groups which are available in the polymer backbone for linking the pentaarylcyclopenta-dienyl radical. Exemplary compounds which include a group with which the pentaarylcyclopentadienyl radical can be bonded to the polymer backbone are shown below. In accordance with this, in the parent structure shown in formula I, one of the phenyl groups is substituted with a corresponding reactive group as shown in the:

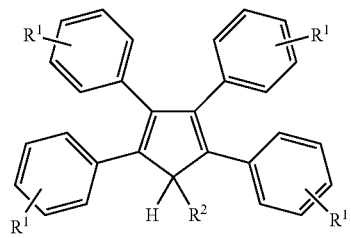

(II)

where $R^2$ is one of the following:

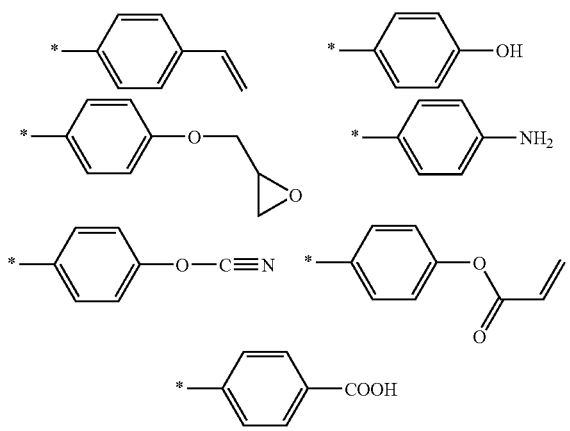

In formula II, the group via which bonding to the polymer backbone is achieved is provided on the phenyl ring in position 5 on the central cyclopentadienyl group. The group via which bonding to the polymer backbone is achieved can, however, also be arranged on any of the other four phenyl rings. Accordingly, the hydrogen atom arranged on the central cyclopentadienyl radical can in principle be arranged on any desired carbon atom of the central cyclopentadienyl radical. In the groups $R^2$, the groups via which bonding to the polymer backbone is achieved are arranged in each case in the para-position relative to the position with which the phenyl radical is bonded to the central cyclopentadienyl radical. However, the groups can in principle also be arranged on any other carbon atom of the phenyl radical. For steric reasons, however, the p-position is preferred.

The polymer backbone can be chosen as desired provided that it ensures sufficient mechanical stability of the polymer. The polymer backbone is preferably composed of carbon atoms. Such a carbon chain can be easily produced by free radical polymerization of corresponding unsaturated monomers. Suitable free radical polymerization processes useful in obtaining the polymers of the present invention are known to those skilled in the art.

In addition to a purely mechanical function for stabilizing the polymer according to the invention, the polymer backbone can also perform further tasks. As already explained above, the cyclopentadienyl radical cation can be stabilized by eliminating a proton. If protic groups are bonded to the polymer backbone, they can accept the donated proton or, in the case of a reduction of the radical, can donate a proton, which is then accepted by the cyclopentadienyl radical.

The spatial distance between the individual pentaarylcyclopentadienyl groups on the polymer chain can be adjusted by providing at least one second comonomer which carries no pentaarylcyclopentadienyl radical. In order to obtain a polymer having a backbone including a carbon chain, a first comonomer which has a polymerizable carbon-carbon double bond and a pentaarylcyclopenta-1,3-dienyl radical can be copolymerized with at least one second comonomer which has a polymerizable carbon-carbon double bond. The first comonomer is such that a group having a polymerizable carbon-carbon double bond is provided on one of the phenyl rings of the pentaphenylcyclopentyl radical. This may be, for example, a vinyl group or a (meth)acryloyloxy group. The second comonomer can be such that, apart from the polymerizable carbon-carbon double bond, no further functional group is provided. An example of such a second comonomer is styrene.

However, the second comonomer may also carry a further functional group. Second comonomers which have a protic group are preferred. A protic group is understood as meaning a group which can accept or donate a proton.

Preferred examples of second comonomers which have a protic group are p-styrenesulfonic acid, (meth)acrylic acid, vinylpyridine and vinylpyrrolidone.

The polymer may be composed of only two comonomers. However, it is also possible to provide further comonomers. For example, in addition to the first comonomer which carries the pentaarylcyclopenta-1,3-dienyl radical, it is possible to provide a second comonomer which carries a protic group and a third comonomer which carries no further functional group. It is also possible to use mixtures of comonomers which carry different protic groups. A plurality of different comonomers which have no further functional group can also be used.

The semiconductor properties of the polymer can be influenced by the number of pentaarylcyclopentadienyl groups which are contained in the polymer. The number of these groups can be adjusted by the molar ratio of the comonomers from which the polymer according to the invention is obtained. Preferably, first and second comonomers or first and further comonomers are contained in a molar ratio of from 1:1 to 100:1 in the polymer.

The polymer described above exhibits a resistive hysteresis effect. This hysteresis effect can be utilized for the production of memory elements. The invention therefore also relates to a resistive memory element including a memory cell with at least one actuatable first contact, one second contact and one storage medium arranged between first and second contacts, where the storage medium is formed from the polymer described above.

If a voltage is applied to the memory cell of the resistive memory element and the voltage is slowly increased, the pentaarylcyclopentadienyl radicals contained in the polymer according to the invention act as traps for the charge carriers. At a low voltage, no current flows through the memory cell. If the voltage is further increased, a critical voltage $V_{crit.}$ is finally reached, at which an abrupt increase in the current is observed. The memory cell thus becomes conductive. In a proposed model, all charge carrier traps in the storage medium are full at the critical voltage $V_{Crit.}$. Transport of the charge carriers by the storage medium can now take place. If the voltage is now reduced again, the memory cell remains in the conductive state until a voltage $V_{hold}$ is reached, at which the storage medium returns to a nonconductive state. At a voltage $V_s$, which is between $V_{hold}$ and $V_{crit.}$, it is therefore possible to measure two different currents, depending on whether the memory cell is in the conductive or in the nonconductive state. The values 1 and 0 can therefore be assigned to these two states. If the memory element is to be switched between the states 0 and 1, the voltage applied to the memory cell must accordingly be chosen to be higher than $V_{crit.}$ or lower than $V_{hold}$.

The contacts by which the charge carriers are fed to the storage medium or removed therefrom consist of a material which has as high an electrical conductivity as possible. For example, electrically conductive organic polymers, such as polyaniline or polythiophene, which acquire a high electrical conductivity as a result of doping, are suitable.

However, the first and second contacts are preferably produced from metal. Metals have a very high electrical conductivity and can generally be processed with relative ease. Examples of suitable metals are gold and aluminum.

The first and second contacts may be composed of the same material. For example, first and second contacts may be in the form of gold electrodes. However, it is also possible for first and second contacts to be composed of different materials. This may result, on the one hand, from the process conditions under which the contacts are produced. For example, aluminum can be very easily applied to a layer of the storage medium with the aid of a shadow mask. If different materials are used for first and second contacts, they have different work functions for the charge carriers. In this way, the memory cell can also assume a diode characteristic so that, when the memory cells are arranged in the form of a matrix, parasitic currents can be substantially suppressed.

When the critical voltage $V_{crit.}$ is exceeded, the level of the current flowing through the memory cell increases abruptly. In order to be able to determine the state of the memory cell, it is therefore advantageous to provide a constant resistance which is connected in series with the memory cell. By measuring the voltage drop across the constant resistance, the conduction state of the memory cell can therefore be determined more simply.

The memory cell of the resistive memory element according to the invention can be produced in very small dimensions and may also assume dimensions in the region of less than 100 nm. A large number of memory cells can therefore be arranged on a given area (e.g., in the form of a matrix). The invention therefore also relates to a memory field which comprises at least two memory elements which can be switched between two information states, with a control device being provided that controls the information state of each memory element.

The memory field can be designed in a customary manner. For example, word and bit lines can be arranged below and above a layer of the polymer described above, at the points of intersection of which a memory cell is formed in each case. By applying a voltage between a certain word line and a certain bit line, the information content of a certain memory cell can then be modified or read out. It is, however, also possible to coordinate with each individual memory cell a transistor by means of which the information state of this cell is controlled.

The pentaarylcyclopentadienyl units contained in the polymer according to the invention can stabilize the state of the filled traps in a memory cell and thus permit the formation of current paths. Pentaarylcyclopentadienyl radicals are extremely stable and thus reduce the sensitivity of the system to external influences. If a hole is injected into the polymer-bonded cyclopentadienyl unit by oxidation, a radical cation forms. The proton bonded to the cyclopentadienyl group can be eliminated and, for example, can be accepted by the polymer backbone. On return to the ground state through reduction of the cyclopentadienyl radical, the proton is accepted again. The system can be converted reversibly into the two states. The mechanism of hole injection into the storage medium is shown schematically below:

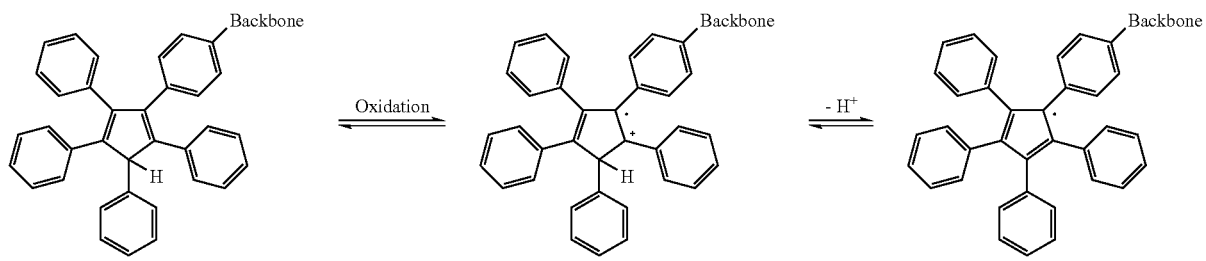

In the mechanism depicted above, the polymer backbone and the group to which the pentaphenylcyclopentadienyl radical is bonded are defined as the "backbone".

Figure 1B:
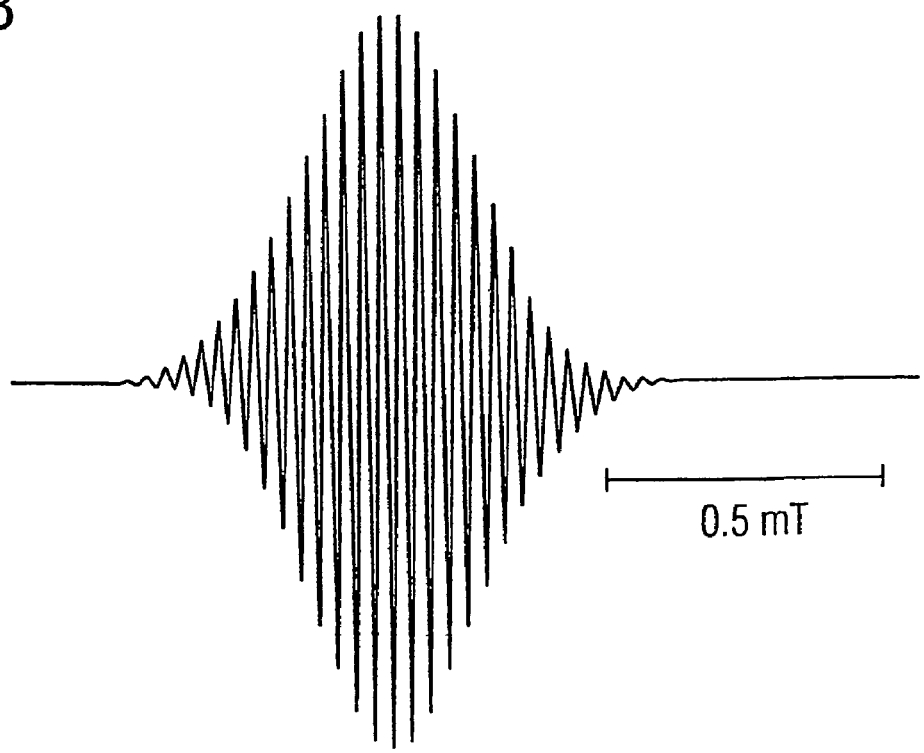

The radical electron is delocalized over all carbon atoms of the pentaphenylcyclopentadienyl system. This is shown by the electron spin resonance spectrum shown in FIGS. 1A and 1B. FIG. 1A shows the simulated ESR spectrum of $C_5Ph_5 \cdot$. It was assumed that the unpaired electron couples with the 15 ortho and para H atoms with the coupling constant $2a$. Each of these 16 lines is split into 11 lines by coupling with the 10 meta H atoms (coupling constant a). The spectrum thus contains 41 lines. FIG. 1B shows the measured ESR spectrum of the pentaphenylcyclopentadienyl radical (g=2.00308, coupling constant a=0.20-0.35 G, at least 31 lines visible).

Figure 2:
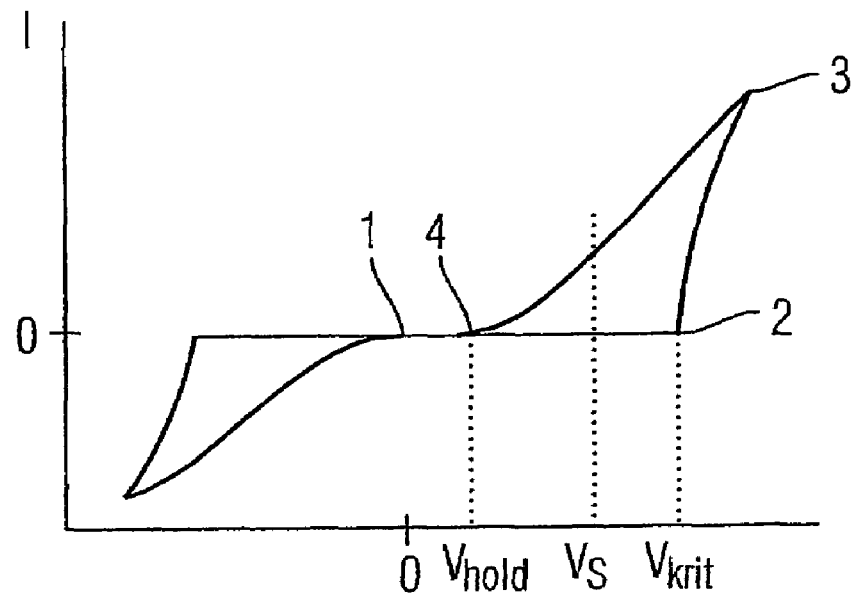
FIG. 2 is a diagram showing a current-voltage curve as obtained using the memory element according to the invention.

FIG. 2 shows a current-voltage curve that is obtained when a memory cell according to the invention is connected in series to a constant resistance and the voltage drop across the resistance is measured. Starting from the voltage-free state 1 and increasing the voltage continuously, no current flows until the memory cell finally becomes conductive at a critical voltage $V_{crit.}$, 2. The level of the current increases abruptly, the current being substantially determined by the constant resistance on further increasing the voltage. If the voltage is reduced again after the memory cell was switched to the conductive state (3), the memory cells remains in the conductive state so that the increase of the current-voltage curve is determined substantially by the constant resistance. At a certain voltage ($V_{hold}$, 4), the memory cell returns to the electrically nonconductive state, so that no more current flows through the constant resistance. For a voltage $V_S$ between $V_{hold}$ and $V_{crit.}$, two different currents are measured, depending on whether the memory cell is in the electrically conductive or in the electrically nonconductive state.

Figure 3:
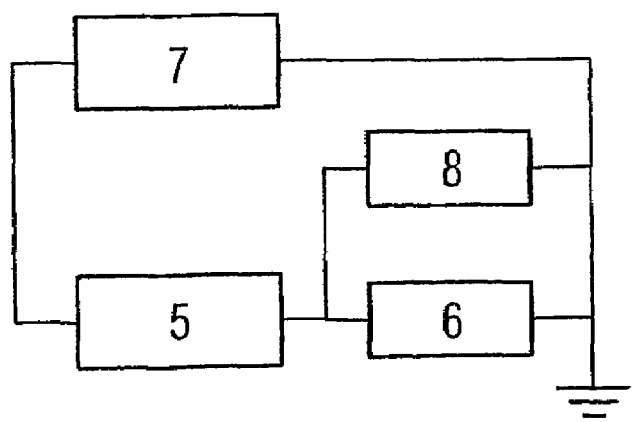
FIG. 3 depicts a circuit used for writing to and reading from a memory cell in accordance with the present invention.

FIG. 3 schematically shows an arrangement for writing to or reading from a memory cell 5 according to the invention. A resistor 6 with constant resistance is connected in series with the memory cell 5. In order to write to the memory cell 5, a write circuit 7 is provided, by means of which it is possible to apply to the memory cell 5 a voltage which is greater than $V_{crit.}$ in order to switch the memory cell 5 to the conductive state or which is lower than $V_{hold}$ in order to switch the memory cell 5 to the nonconductive state. To read the information stored in the memory cell 5 (i.e. for determining whether the memory cell is in the conductive or nonconductive state), a constant voltage $V_S$ which is between the voltage $V_{hold}$ and the voltage $V_{crit.}$ is applied to the memory cell 5. A read circuit 8 measures the voltage drop across the resistor 6 with constant resistance, which is then coordinated with the two states 1 and 0 of the memory cell 5.

Figure 4:
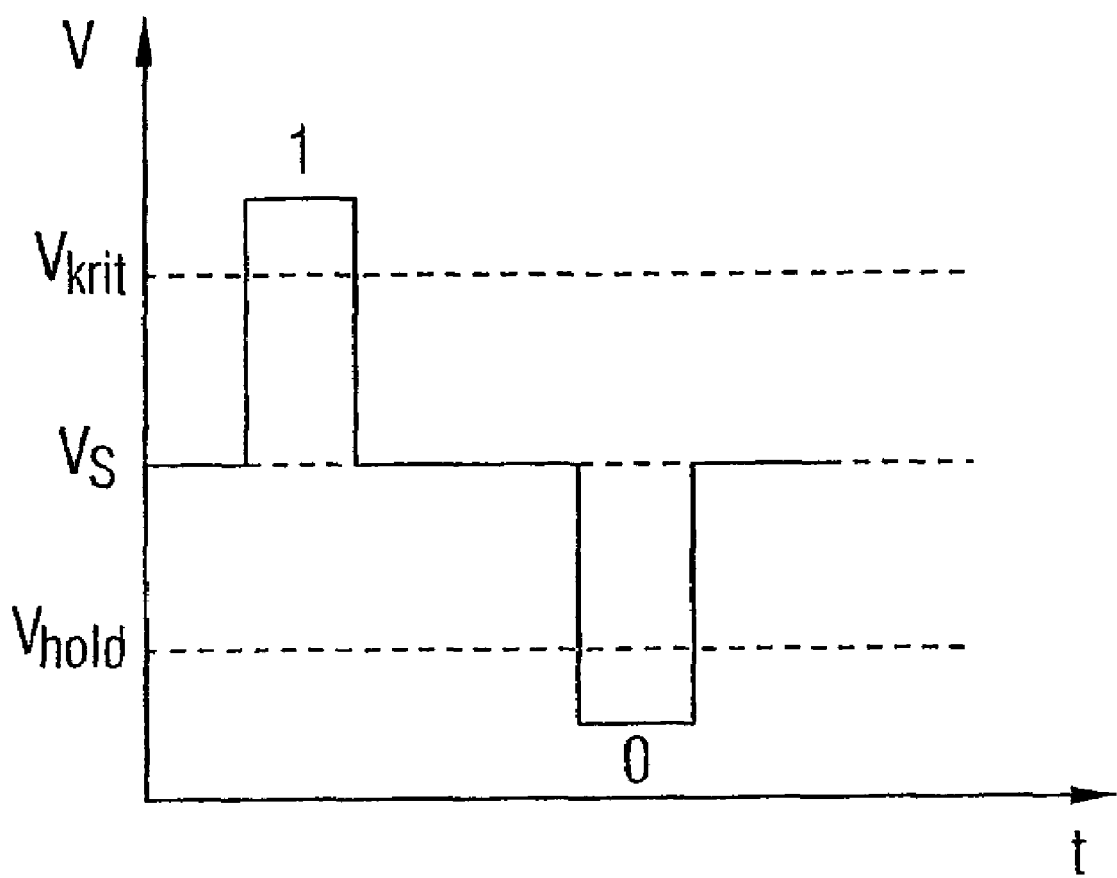
FIG. 4 is a voltage diagram showing a switching process of the memory cell between the states 1 and 0.

FIG. 4 schematically shows the curve of the voltage applied to the memory cell 5 during the write process. In order to obtain the information stored in the memory cell 5, the memory cell 5 is kept at a voltage $V_S$ which is greater than $V_{hold}$ and less than $V_{crit.}$. In order to switch the memory cell 5 to the conductive state, a voltage which is greater than $V_{crit.}$ is applied. The memory cell 5 is now in the conductive state, which is coordinated, for example, with the state 1. This state is maintained for as long as the voltage $V_S$ is present at the memory cell 5. In order to switch the memory cell 5 from the conductive state to the nonconductive state, the voltage applied to the memory cell 5 is reduced to a value which is lower than $V_{hold}$. In the arrangement of FIG. 3, the value 0 is coordinated with the nonconductive state. If the voltage is then increased again to $V_S$, the memory cell 5 remains in the nonconductive state, i.e. in the information state 0. On reading out the memory cell 5, a voltage drop of 0 is accordingly measured across the resistance 6.

Figure 5:
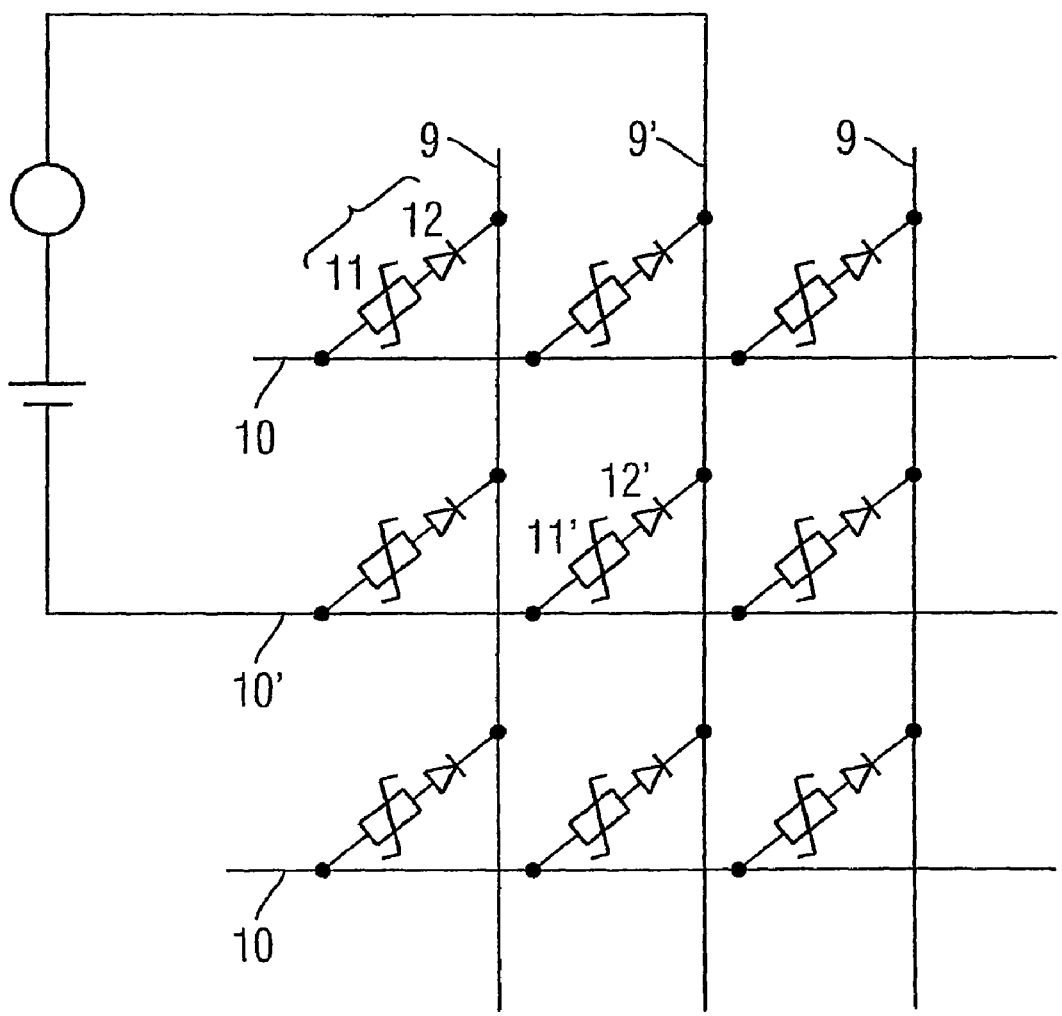
FIG. 5 depicts a memory field which is designed as a passive matrix in accordance with the present invention.

FIG. 5 schematically shows a matrix arrangement in which the resistive memory elements according to the invention are decoupled by diodes. The matrix is formed from column lines 9 and row lines 10. Each component, formed from a memory cell 111 and a diode 12, is connected in each case to a column line 9 and a row line 10. If, for example, the memory cell 11' is to be switched from the state 0 to the state 1, a voltage which is greater than $V_{crit.}$ is applied to the column line 9' and the row line 10'. Thus, only the diode 12' is selectively switched to the forward direction while all other possible current paths always contain at least one diode 12 in the reverse direction. Thus, the electrical conductivity or the information content of the memory cell 11' can be selectively switched. FIG. 4 shows only one possibility for decoupling the memory cells 11 in a memory field. However, it is also possible to decouple row lines and column lines, for example, by means of transistors. In order to write to the memory cell, in each case only the coordinated transistor is switched to the conductive state. In addition to the matrix arrangement shown, memory fields in which each resistive memory element can be selectively written to or read from by means of a transistor are also possible.

The pentaarylcyclopentadienes required for the preparation of the polymer can be prepared by various routes or techniques. A first synthesis route is shown schematically below. For the sake of simplicity, substituents on the aryl rings are not reproduced. One of the phenyl rings carries a group (not shown) which permits bonding to the polymer backbone.

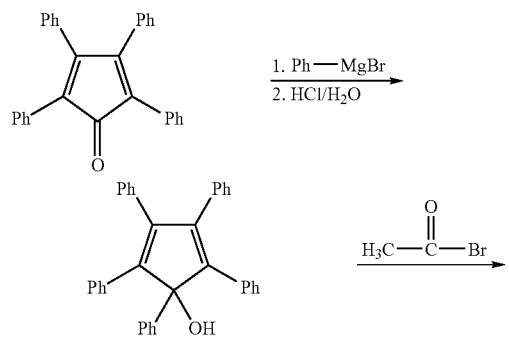

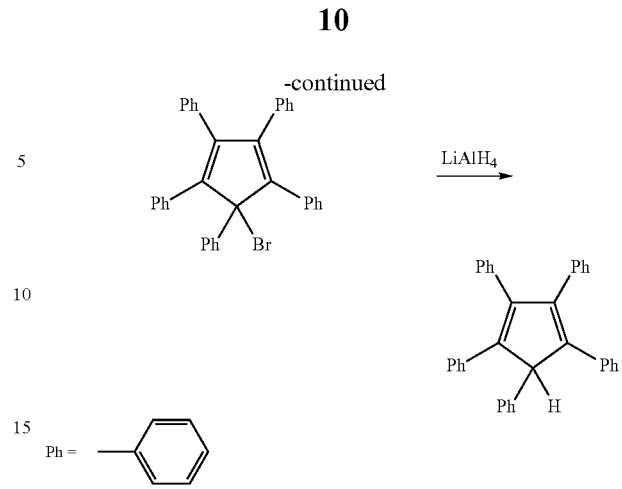

The synthesis route shown above is based on work by Ziegler and Schnell (K. Ziegler, B. Schnell, *Liebigs Ann. Chem.* 445 (1925), 266). Starting from tetraarylcyclopentadienone, a fifth phenyl group is first introduced into the molecule by means of a Grignard reagent. Aqueous acidic working-up gives the 1,2,3,4,5-pentaarylcyclopenta-1,3-dien-5-ol. The arylmagnesium bromide is used in excess. The hydroxyl group is then converted into bromide with acetyl bromide. By reduction with a suitable reducing agent, for example $LiAlH_4$, the desired pentaarylcyclopenta-1,3-diene is finally obtained.

A further synthesis route is shown below:

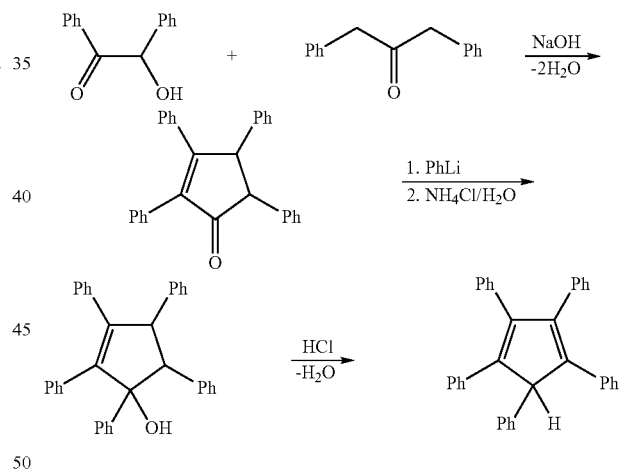

The synthesis route starts from 2,3,4,5-tetraarylcyclopent-2-enone, the condensate of benzoin and 1,3-diphenylacetone. The 2,3,4,5-tetraphenylcyclopenten-2-one reacts with an excess of aryllithium to give 1,2,3,4,5-pentaarylcyclopenta-2,4-dien-1-ol. By subsequent elimination of water, the desired 1,2,3,4,5-pentaarylcyclopenta-1,3-diene is obtained.

EXAMPLE 1

Formation of 1,2,3,4-Tetraphenyl-5-p-vinylphenylcyclopenta-1,3-diene 1,2,3,4-Tetraphenyl-5-p-vinylphenylcyclopenta-1,3-dien-5-ol 46.2 g (0.12 mol) of tetraphenylcyclopentadienone were reacted with 0.61 mol of p-vinylphenylmagnesium bromide in 400 ml of ether and then hydrolysis to yield 1,2,3,4-tetraphenyl-5-p-vinylphenylcyclopenta-1,3-dien-5-ol. (Elemental analysis for $C_{37}H_{28}O$: found: C, 90.91%, H, 5.75%. calculated: C, 90.85%, H, 5.78%).

5-Bromo-1,2,3,4-tetraphenyl-5-p-vinylphenylcyclopenta-1,3-diene 53.74 g (0.11 mol) of 1,2,3,4-tetraphenyl-5-p-vinylphenylcyclopenta-1,3-dien-5-ol were suspended in 300 ml of toluene. 74 g (0.6 mol) of acetyl bromide were added dropwise in the course of 20 minutes at room temperature and the reaction batch was then refluxed for 2 hours. Toward the end of the reaction, 2 ml of methanol were also added dropwise. Excess acetyl bromide and toluene were distilled off in vacuo. The remaining oil crystallized after addition of 100 ml of petroleum ether. The orange precipitate was filtered off with suction, rinsed with petroleum ether and dried. The product was used for the further syntheses. Analytically pure orange product was obtained by recrystallization from toluene (yield: 55.15 g (91%); elemental analysis for $C_{37}H_{27}Br$: found: C, 80.62%, H, 4.89%. calculated: C, 80.58%, H, 4.93%).

1,2,3,4-Tetraphenyl-5-p-vinylphenylcyclopenta-1,3-diene

A suspension of 55.1 g (0.1 mol) of 5-bromo-1,2,3,4-tetraphenyl-5-p-vinylphenylcyclopenta-1,3-diene in 300 ml of ether was added in portions to a suspension of 11.5 g (0.3 mol) of Li[AlH$_4$] in 150 ml of ether with stirring. The slightly yellow-brown suspension formed was refluxed for 2 hours to complete the reduction. After cooling to room temperature, excess Li[AlH$_4$] was hydrolyzed first with ice water (caution: vigorous H$_2$ evolution) and then with dilute hydrochloric acid. All volatile organic components were then distilled off from the reaction mixture using a rotary evaporator. The slightly yellow crude product was filtered off with suction and washed several times with water. For further purification, it was dried azeotropically with toluene, filtered and recrystallized (yield: 39.65 g (84%); found: C, 94.09%, H, 5.81%. calculated: C, 94.03%, H, 5.97%).

EXAMPLE 2

Formation of 1,2,4,5-Tetraphenyl-3-p-vinylphenylcyclopenta-1,3-diene 2,3,4,5-Tetraphenylcyclopent-2-enone (M=386.5 g/mol)

Figure 6:
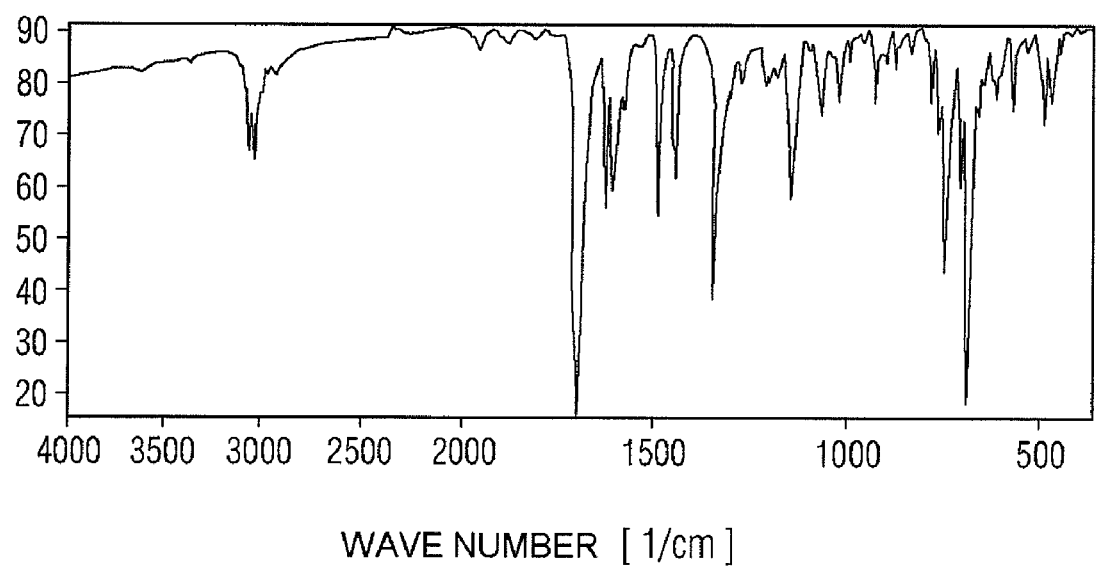
FIG. 6 is a diagram depicting an IR spectrum of 2,3,4,5-tetraphenylcyclopent-2-enone.

2,3,4,5-Tetraphenylcyclopent-2-enone was prepared from dibenzyl ketone and benzoin by a method of Dilthey and Quint, W. Dilthey, O. Trösken, K Plum, W. Schommer, *J. prakt. Chem.* 141 (1934) 331 (yield: 59%; m.p.: 162-163° C., literature: 162-163° C., elemental analysis for $C_{29}H_{22}O$: found: C, 89.4%, H, 6.0%. calculated: C, 90.12%, H, 5.7%). The IR spectrum of 2,3,4,5-tetraphenylcyclopent-2-enone is shown in FIG. 6.

1,2,4,5-Tetraphenyl-3-β-vinylphenylcyclopenta-1,3-diene (472.63 g/mol)

1,2,4,5-Tetraphenyl-3-p-vinylphenylcyclopenta-1,3-diene was prepared from 37.8 g (0.098 mol) of 2,3,4,5-tetraphenylcyclopent-2-enone and 0.5 mol of p-vinylphenyllithium (from 7 g (1 mol) of Li and 91.52 g (0.5 mol of bromostyrene) in 300 ml of ether and was purified analogously to 1,2,3,4-tetraphenyl-5-p-vinylphenylcyclopenta-1,3-diene. (Yield: 37 g (80%))

EXAMPLE 3

Formation of 1,2,3,4-Tetra-p-tolyl-5-p-vinylphenylcyclopenta-1,3-diene 1,3-Bis(p-tolyl)-2-propanone (M=210.28 g/mol)

Figure 7:
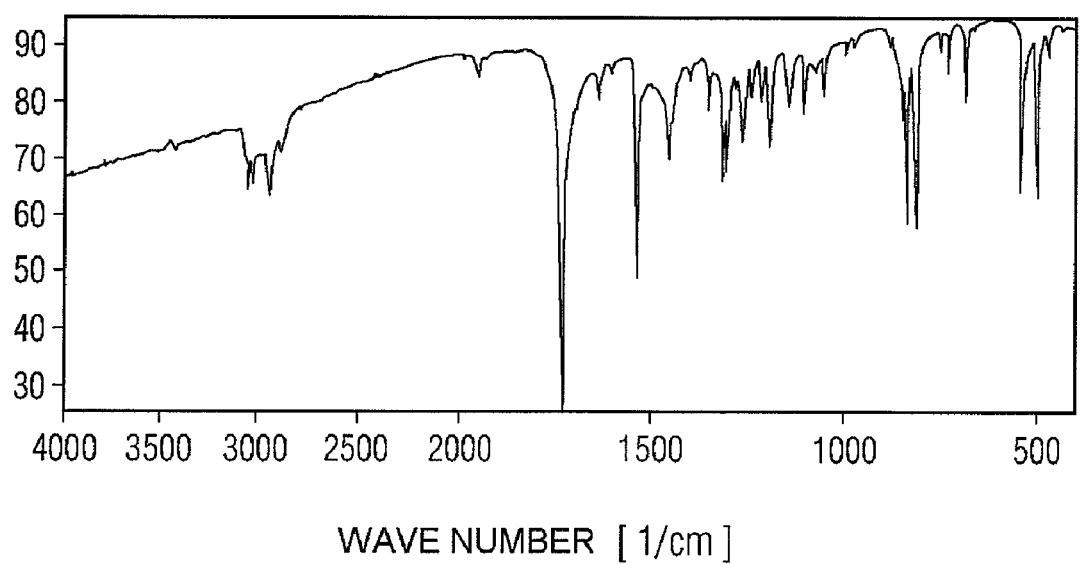
FIG. 7 is a diagram depicting an IR spectrum of 1,3-bis-(p-tolyl)-2-propanone.

Isopropylmagnesium bromide was prepared from 24.3 g (1 mol) of Mg and 123 g of isopropyl bromide (1 mol) in 500 ml of ether (standard method for the preparation of Grignard reagents). 100 g (0.56 mol) of ethyl p-tolylacetate were slowly added dropwise to this solution at 0° C. with stirring, evolution of propane occurring and a gray precipitate separating out. The reaction mixture was allowed to stand overnight at room temperature and was hydrolyzed first with 10% strength NH$_4$Cl solution and then with dilute hydrochloric acid. The ether phase was separated off and the aqueous phase was extracted with ether. The combined organic phases were washed with dilute NaOH and water and dried over Na$_2$SO$_4$. After the solvent had been stripped off, the β-ketoester remained in the form of a virtually colorless oil. It was dissolved in 1 L of glacial acetic acid and refluxed with 150 ml of 18% strength HCl until no further CO$_2$ evolution was observable by means of a bubble counter. The batch was evaporated down to 150 ml, neutralized with 10% strength sodium hydroxide solution and extracted several times with ether. The combined ether phases were dried over Na$_2$SO$_4$. After the ether had been stripped off, 1,3-bis-(p-tolyl)propanone remained as a pale orange oil. When taken up in 100 ml of pentane, 1 cm tabular, soft crystals crystallized out overnight (yield: 50.0 g (75%); m.p.: 55-56° C., literature: 53.2-54.4° C. [15], 30-32° C. [16], elemental analysis: found: C, 85.7%, H, 7.5%. calculated: C, 85.67%, H, 7.61%). The IR spectrum of 1,3-bis(p-tolyl)-2-propanone is shown in FIG. 7. Literature source: S. B. Coan, D. E. Trucker, E. I. Becker, *J. Amer. Chem. Soc.* 77 (1955) 60; L. D. Field, *Inorg. Chem.* 32 (1993) 211.

Crystal data and structure determination of 1,3-bis(p-tolyl)-2-propanone

The X-ray measurements were carried out using graphite-monochromated MoK$_\alpha$ radiation (λ=0.71069 Å) on a crystal which was slightly too large (1.0 mm×1.0 mm×0.5 mm) at room temperature on a Huber diffractometer. The crystal was stuck to a glass filament by means of epoxy adhesive. Crystal data of 1,3-bis(p-tolyl)-2-propanone ($C_{17}H_{18}O$, M=283.3 g/mol): monoclinic, space group C2/c, lattice constants a 27.118 (18), b 6.112(4), c 8.673(6)Å, β98.076(38)°, Z=4, $D_{calc}$=1.112 g cm$^{-3}$, μ=0.35 cm$^{-1}$. The intensity data were collected in the θ/2θ mode; $2θ_{max}$=50°. Of the 1135 independent observed reflections, 970 reflections with $F_0$>2σ($F_0$) were used for the further calculations. The structure was completely solved by iterative symbolic addition. All non-hydrogen atoms were refined anisotropically. Hydrogens were included in the refinement in the calculated position, riding on the respective carbon atoms. The final R value was 0.107. The maximum residual electron density was 0.3 e/Å$^3$ (for atomic parameters, see table 1).

TABLE 1

Atomic parameters of 1,3-Bis(p-tolyl)-2-propanone

| Atom | X | Y | Z | U11 | U22 | U33 | U23 | U13 | U12 |
|---|---|---|---|---|---|---|---|---|---|
| C(1) | 0.5000 | 0.009(2) | 0.7500 | 0.046 | 0.083(7) | 0.046(5) | 0.000 | −0.021(4) | 0.000 |
| O(1) | 0.5000 | −0.186(1) | 0.7500 | 0.064(4) | 0.085(6) | 0.124(7) | 0.000 | −0.032(4) | 0.000 |
| C(20) | 0.4611(2) | 0.014(1) | 0.8239(6) | 0.054(3) | 0.118(7) | 0.034(3) | −0.004(4) | −0.006(3) | 0.001(4) |
| C(21) | 0.4180(2) | 0.203(1) | 0.6953(6) | 0.047(3) | 0.071(4) | 0.040(3) | −0.005(3) | 0.011(2) | 0.001(3) |
| C(22) | 0.4156(2) | 0.405(1) | 0.6268(7) | 0.057(4) | 0.068(5) | 0.063(4) | −0.004(4) | 0.009(3) | −0.009(3) |
| C(23) | 0.3764(2) | 0.459(1) | 0.5078(8) | 0.068(4) | 0.070(5) | 0.067(4) | 0.012(4) | 0.017(3) | 0.007(4) |
| C(24) | 0.3395(2) | 0.305(1) | 0.4621(7) | 0.047(3) | 0.083(5) | 0.052(4) | 0.001(4) | 0.009(3) | 0.013(4) |
| C(25) | 0.3422(2) | 0.102(1) | 0.5301(7) | 0.043(5) | 0.078(5) | 0.067(4) | −0.007(4) | 0.004(3) | −0.006(3) |
| C(26) | 0.3815(2) | 0.046(1) | 0.6484(7) | 0.050(3) | 0.066(4) | 0.060(4) | 0.006(3) | 0.014(3) | −0.001(3) |
| C(3) | 0.2972(2) | 0.366(2) | 0.3325(8) | 0.056(4) | 0.149(9) | 0.078(5) | 0.011(5) | −0.010(4) | 0.026(5) |

4,4'-Dimethylbenzoin (M+240.3 g/mol)

Figure 8:
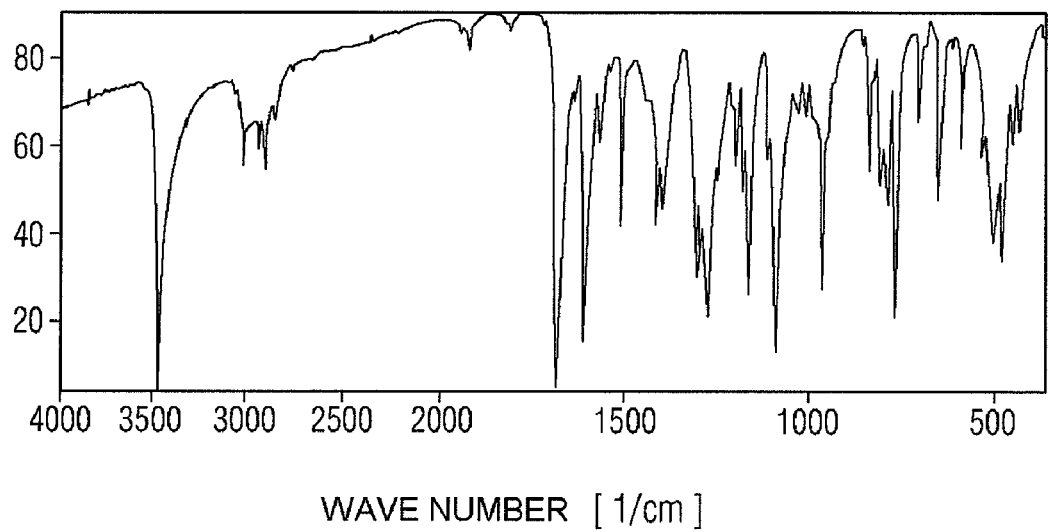
FIG. 8 is a diagram depicting an IR spectrum of 4,4'-dimethylbenzoin.

250 g (2.08 mol) of p-methylbenzaldehyde were condensed with the aid of 30 g (0.46 mol) of KCN to give 4,4'-dimethylbenzoin according to a standard method (*Organikum* 18*th edition* (1990) 457). The crude product was used without further purification (yield, crude: found: C, 80.0%, H, 6.4%. calculated: 79.97%, H, 6.71%). The IR spectrum of 4,4'-dimethylbenzoin is shown in FIG. 8.

4,4'-Dimethylbenzil (M=238.3 g/mol)

Figure 9:
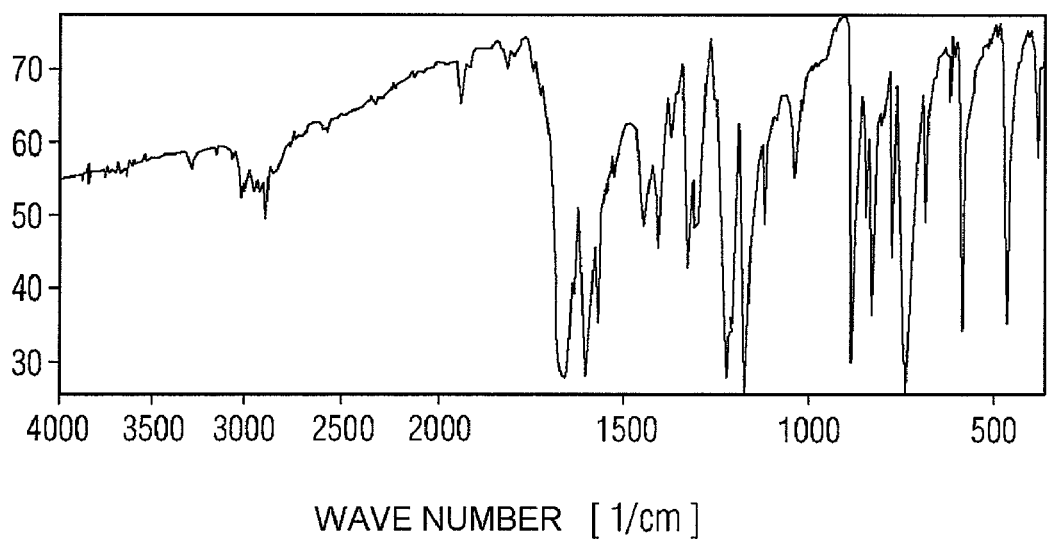
FIG. 9 is a diagram depicting an IR spectrum of 4,4'-dimethylbenzil.

4,4'-Dimethylbenzil was prepared on the basis of a known method for benzil (L. F. Tietze, Th. Eicher, *Reaktionen und Synthesen*[Reactions and Syntheses], R. Stierlein, *Chem. Ber.* 22/1 (1889) 37). 420 g of $CuSO_4 \cdot 5H_2O$ (1.68 mol) were dissolved in a mixture of 350 ml of water and 400 ml of pyridine bases while heating. 190 g (0.79 mol) of crude 4,4'-dimethylbenzoin were added to the still warm solution, and refluxing was effected for 4 hours. After cooling to room temperature, the crude product was filtered off and washed with water. The filter residue was taken up in ether, filtered and dried with $Na_2SO_4$. After the solution had been evaporated down to about 500 ml, 4,4'-dimethylbenzil crystallized out in the form of pale yellow crystals. Depending on their use, they were recrystallized from ethanol (yield 119.9 g (64%, based on crude 4,4'-dimethylbenzoin used); m.p.: 104° C., literature: 104-105° C. The IR spectrum of 4,4'-dimethylbenzil is shown in FIG. 9.

1,2,3,4-Tetra(p-tolyl)cyclopenta-1,3-dien-5-one (M=440.58 g/mol)

Figure 10:
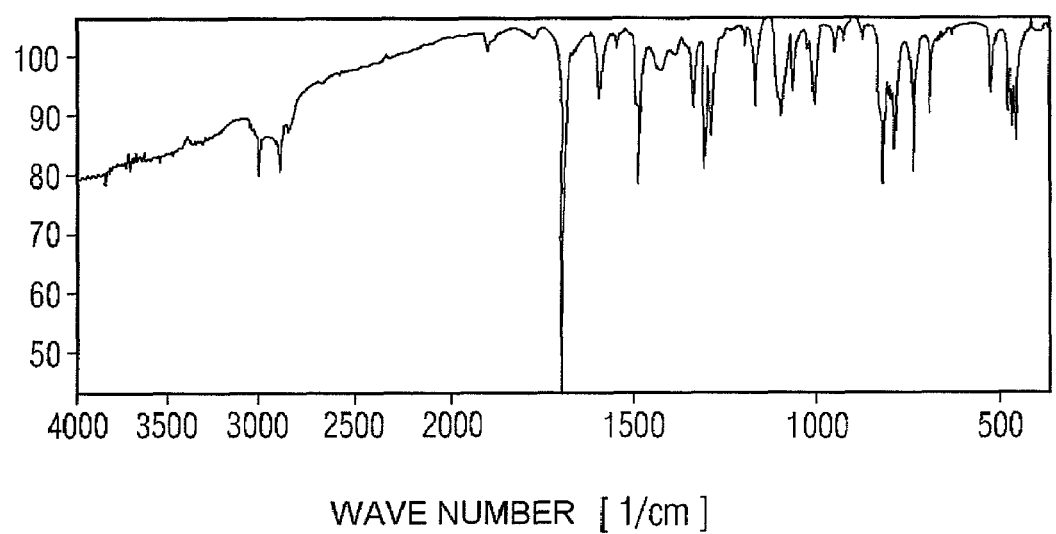
FIG. 10 is a diagram depicting an IR spectrum of 1,2,3,4-tetra(p-tolyl)-cyclopenta-1,3-dien-5-one.

23.13 g (0.11 mol) of 1,3-bis(p-tolyl)-2-propanone and 26.2 g (0.11 mol) of 4,4'-dimethylbenzil were dissolved in 75 ml of hot ethanol (abs.). 53 ml of a methanolic benzyltrimethylammonium hydroxide solution (0.11 mol Triton B, 35% Fluka) were slowly added dropwise at 80° C. with stirring (caution: the reaction batch froths vigorously) and refluxing was effected for 25 minutes. The crude product was filtered off after three hours, then washed with cold ethanol and recrystallized from toluene (violet red, yield: 46.2 g (95%); m.p.: 244-245° C., literature: 250.4-251.4° C. [15]; elemental analysis for $C_{33}H_{38}O$: found: C, 89.8%, H, 6.6%. calculated: C, 89.96%, H, 6.41%, MS-El [m/z (rel. intensity): M⁺440 (100), 412 (47), 206 (98), 191 (16), 189 (10)). The IR spectrum of 1,2,3,4-tetra(p-tolyl)cyclopenta-1,3-dien-5-one is shown in FIG. 10.

1,2,3,4-Tetra(p-tolyl)-5-p-vinylphenylcyclopenta-1,3-dien-5-ol

The Grignard reagent p-vinylphenylmagnesium bromide was prepared from 8.5 g (0.35 mol) of Mg and 64.07 g (0.35 mol) of p-bromostyrene in 400 ml of ether. 26.5 g (0.06 mol) of tetra(p-tolyl)cyclopentadienone were added in portions so that the solution was kept at the boil. Within the course of two hours, the reaction batch acquired a dark orange and then a pale yellow color. After cooling to room temperature, hydrolysis was effected slowly with 200 ml of 10% strength $NH_4Cl$ solution and then with dilute HCl. The ether phase was separated off, and the aqueous phase was extracted several times with ether. The combined organic phases were washed with $NaHCO_3$ solution and dried over $Na_2SO_4$. After the ether had been stripped off, a red oil remained, which can be crystallized with the aid of an emulsion of methanol and heptane. The crude product was filtered off with suction and washed with heptane. Analytically pure product was obtained by repeated boiling with heptane in an ultrasonic bath (yield: 26.11 g (80%); elemental analysis for $C_{41}H_{36}O$: found: C, 90.31%, H, 6.45%. calculated: C, 90.40%, H, 6.66%).

5-Bromo-1,2,3,4-tetra(p-tolyl)-5-p-vinylphenylcyclopenta-1,3-diene 34.32 g (0.063 mol) of 1,2,3,4-tetra(p-tolyl)-5-p-vinylphenylcyclopenta-1,3-dien-5-ol were brominated with 32 ml (52.8 g, 0.43 mol) of acetyl bromide in toluene, analogously to 1,2,3,4-tetraphenyl-5-p-vinylphenylcyclopenta-1,3-dien-5-ol (yellow-orange product, yield: 31.73 g (83%); elemental analysis for $C_{41}H_{35}Br$: found: C, 80.51%, H, 5.86%. calculated: C, 81.04%, H, 5.81%).

1,2,3,4-Tetra-p-tolyl-5-p-vinylphenylcyclopenta-1,3-diene (M=528.74 g/mol)

20.66 g (0.034 mol) of 5-bromo-1,2,3,4-tetra(p-tolyl)-5-p-vinylphenylcyclopenta-1,3-diene were reduced with 5.3 g of Li[AlH₄] (0.14 mol) to 1,2,3,4-tetra-p-tolyl-5-p-vinylphenylcyclopenta-1,3-diene, analogously to the method for the preparation of 1,2,3,4-tetraphenyl-5-p-vinylphenylcyclopenta-1,3-diene (luminescent yellow product, yield: 14.9 g (83%); elemental analysis for $C_{41}H_{36}$: found: C, 92.79%, H, 6.85%. calculated: C, 93.14%, H, 6.86%).

EXAMPLE 4

Polymerization 4.73 g (10 mmol) of 1,2,3,4-tetraphenyl-5-p-vinylphenylcyclopenta-1,3-diene are dissolved in 150 ml of warmed xylene (isomer mixture, absolute). After cooling to room temperature, 10.42 g (100 mmol) of styrene freshly distilled over sulfur are added. 300 mg of benzoyl peroxide in 20 ml of xylene are then added to the solution. After heating to 80° C. for 6 hours, the cold reaction solution is slowly added dropwise to methanol. The precipitated yellowish polymer is dried in vacuo for 8 hours. By taking up in xylene and precipitating in methanol, 13.2 g (87%) of slightly fluorescent yellowish polymer are obtained.

In one variation, instead of benzoyl peroxide, 2,2'-azobisisobutyronitrile (AIBN) is used. The reaction is carried out at 70° C. for 10 h.

In another variation, instead of a ratio of 1:10, a polymer with the ratio 1:15 is prepared.

In a further variation, instead of a ratio of 1:10, a polymer with the ratio 1:7 is prepared.

In still another variation, 0.92 g (5 mmol) of styrenesulfonic acid is copolymerized in the above polymer.

In another variation, 0.21 g (2 mmol) of vinylpyridine is copolymerized in the above polymer.

In yeat another variation, instead of 1,2,3,4-tetraphenyl-5-p-inylphenylcyclopenta-1,3-diene, 1,2,3,4-tetra(p-tolyl)-5-p-vinylphenylcyclopenta-1,3-diene is polymerized.

EXAMPLE 5

Layer production 2 g of a polymer from any of the above examples are dissolved in 50 ml of xylene (isomer mixture) and freed from particles by means of a 0.2 μm Teflon membrane filter. The solution is applied to a silicon wafer with 100 nm thermal oxide for 20 s at 2500 rpm by spin coating. The still moist wafer is dried at 100° C. for 2 min. Residual solvent is expelled in an oven at 100° C. (not higher than Tg of polymer) at 100 mbar in an $N_2$ stream (3 l/min). The final layer thickness was 245 nm.

EXAMPLE 6

Substrate production

A thermally oxidized silicon wafer (100 nm oxide) is sputtered with 2 nm titanium and 50 nm of gold (Ar 30 sscm, 4.5 μbar, 350 W). The polymer layer is then deposited as described above in Example 5. 1 mm dots of aluminum are applied by vapor deposition as top electrodes through a shadow mask.

EXAMPLE 7

The hysteresis effect is measured using a circuit according to FIG. 3. The voltage drop at the resistor 6 (1 Mohm) serves as a probe for the state of the memory cell. The state of the memory cell 5 is set via the write circuit 7. If the voltage applied to the memory cell 5 is greater than the switching voltage $V_{crit.}$ of the memory cell 5, the memory cell 5 is converted into a low-impedance state. This persists as long as the voltage applied to the memory cell 5 does not fall below a threshold voltage $V_{hold}$.

EXAMPLE 8

Formation of 1,2,3,4-Tetraphenyl-5-p-hydroxyphenylcyclopenta-1,3-diene 1,2,3,4-Tetraphenyl-5-p-methoxyphenylcyclopenta-1,3-dien-5-ol 46.2 g (0.12 mol) of tetraphenylcyclopentadienone were reacted with 128.91 g (0.61 mol) of p-methoxyphenylmagnesium bromide in 400 ml of ether and hydrolysis to 1,2,3,4-tetraphenyl-5-p-methoxyphenylcyclopenta-1,3-dien-5-ol was then effected. Elemental analysis for $C_{36}H_{28}O_2$: found: C, 87.72%, H, 5.73%. calculated: C, 87.78%, H, 5.73%.

5-Bromo-1,2,3,4-tetraphenyl-5-p-methoxyphenylcyclopenta-1,3-diene 54.19 g (0.11 mol) of 1,2,3,4-tetraphenyl-5-p-methoxyphenylcyclopenta-1,3-dien-5-ol were suspended in 300 ml of toluene. 74 g (0.6 mol) of acetyl bromide were added dropwise in the course of 20 minutes at room temperature and the reaction batch was then refluxed for 2 hours. Toward the end of the reaction, 2 ml of methanol were also added dropwise. Excess acetyl bromide and toluene were distilled off in vacuo. The remaining oil crystallized after addition of 100 ml of petroleum ether. The orange precipitate was filtered off with suction, rinsed with petroleum ether and dried. The product was used for the further syntheses. Analytically pure orange product was obtained by recrystallization from toluene. (Yield: 54. 32 g (89%); elemental analysis for $C_{36}H_{27}OBr$: found: C, 77.06%, H, 4.90%. calculated: C, 77.84%, H, 4.90%).

5-Bromo-1,2,3,4-tetraphenyl-5-p-hydroxyphenylcyclopenta-1,3-diene 44.44 g (0.08 mol) of 5-bromo-1,2,3,4-tetraphenyl-5-p-methoxyphenylcyclopenta-1,3-diene in 400 ml of concentrated HBr were refluxed for 24 h. The product was filtered off with suction and washed with water. It was recrystallized in toluene. (Yield: 35.05 g (81%); elemental analysis for $C_{35}H_{25}OBr$: found: C, 77.60%, H, 4.58%. calculated: C, 77.64%, H, 4.65%).

1,2,3,4-Tetraphenyl-5-p-hydroxyphenylcyclopenta-1,3-diene

A suspension of 54.15 g (0.1 mol) of 5-bromo-1,2,3,4-tetraphenyl-5-p-hydroxyphenylcyclopenta-1,3-diene in 300 ml of ether was added in portions to a suspension of 15.18 g (0.4 mol) of $Li[AlH_4]$ in 200 ml of ether with stirring. The slightly yellow-grey suspension formed was refluxed for 2 hours to complete the reduction. After cooling to room temperature, excess $Li[AlH_4]$ was hydrolyzed first with ice water (caution: vigorous $H_2$ evolution) and then with dilute hydrochloric acid. All volatile organic components were then distilled off from the reaction mixture using a rotary evaporator. The slightly yellow crude product was filtered off with suction and washed several times with water. For further purification, it was dried azeotropically with toluene, filtered and recrystallized. (Yield: 36.5 g (79%); elemental analysis: found: C, 90.04%, H, 5.56%. calculated: C, 90.88%, H, 5.67%).

EXAMPLE 9

Formation of 1,2,3,4-Tetraphenyl-5-p-glycidyloxyphenylcyclopenta-1,3-diene 4.62 g (0.01 mol) of 1,2,3,4-tetraphenyl-5-p-hydroxyphenylcyclopenta-1,3-diene were dissolved in 150 ml of acetone. 1.85 g (0.02 mol) of epichlorohydrin were added at 10° C. with stirring, and 1.52 g (0.015 mol) of triethylamine, dissolved in 20 ml of acetone, were then slowly added dropwise at 5° C. Stirring was effected for 12 h at room temperature. The reaction batch was filtered and the acetone was evaporated in a rotary evaporator. The residue was reprecipitated from chloroform/methanol (yield: 3.83 g (74%); elemental analysis: found: C, 88.13%, H, 5.72%. calculated: C, 88.00%, H, 5.83%).

EXAMPLE 10

Formation of 1,2,3,4-Tetraphenyl-5-p-cyanuratophenylcyclopenta-1,3-diene 4.62 g (0.01 mol) of 1,2,3,4-tetraphenyl-5-p-hydroxyphenylcyclopenta-1,3-diene were dissolved in 300 ml of methylene chloride, and 3.18 g (0.03 mol) of cyanogen bromide were added at 10° C. with stirring. 3.04 g (0.03 mol) of triethylamine were slowly added dropwise at from 0° C. to 5° C. while cooling with ice and with stirring. Stirring was effected for 5 h at 20° C.

100 ml of water were added to the reaction mixture, and the organic phase was separated off and dried over sodium sulfate. The methylene chloride was evaporated in a rotary evaporator and the residue was reprecipitated from toluene/ether at not more than 20° C. (Yield: 3.8 g (78%); elemental analysis: found: C, 88.65%, H, 5.19%. calculated: C, 88.68%, H, 5.17%. IR: OCN band at 2260 cm$^{-1}$).

EXAMPLE 11

Formation of 1,2,3,4-Tetraphenyl-5-p-methacryloxyphenylcyclopenta-1,3-diene 9.25 g (0.02 mol) of 1,2,3,4-tetraphenyl-5-p-hydroxyphenylcyclopenta-1,3-diene were dissolved in 200 ml of dry toluene, 4.62 g (0.03 mol) of methacrylic anhydride were added and refluxing was effected for 12 h. The toluene was evaporated in a rotary evaporator and the residue was reprecipitated from acetone/ether (yield: 9.02 g (85%); elemental analysis: found: C, 88.35%, H, 5.61%. calculated: C, 88.27%, H, 5.70%).

EXAMPLE 12

Formation of polymer of methyl methacrylate and 1,2,3,4-tetraphenyl-5-p-methacryloxyphenylcyclopenta-1,3-diene 5.3 g (0.01 mol) of 1,2,3,4-tetraphenyl-5-p-methacryloxyphenylcyclopenta-1,3-diene, 10 g (0.1 mol) of freshly distilled methyl methacrylate and 3.28 g (0.02 mol) of 2,2'-azobisisobutyronitrile (AIBN) in 200 ml of dry dioxane were stirred for 6 h at 70° C. under nitrogen. After cooling, the polymer was precipitated in 2 l of distilled water and filtered off with suction. After drying, the polymer was reprecipitated from chloroform/methanol and dried.

In a variation, instead of 2,2'-azobisisobutyronitrile (AIBN), benzoyl peroxide was used. The reaction is carried out at 70° C. for 10 h.

In another variation, instead of a ratio of 1:10, a polymer with the ratio 1:15 is prepared.

In a further variation, instead of a ratio of 1:10, a polymer with the ratio 1:7 is prepared.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A polymer having semiconductor properties and comprising a polymer backbone and pentaarylcyclopenta-1,3-dienyl radicals bonded as side groups to the polymer backbone, wherein each pentaarylcyclopenta-1,3-dienyl radical is bonded as a side group to the polymer backbone via a bonding group of one of the phenyl groups of the pentaarylcyclopenta-1,3-dienyl radical and the polymer further includes protic groups bonded to the polymer backbone.

2. The polymer of claim 1, wherein the pentaaryl-cyclopenta-1,3-dienyl radical includes a structure as defined by formula I:

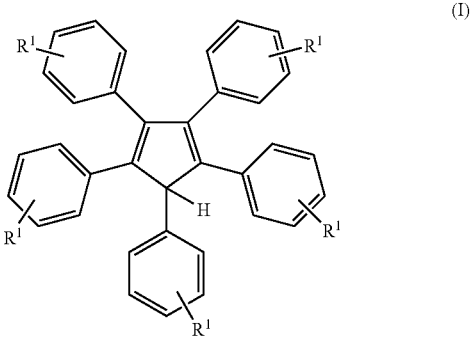

wherein each R$^1$ is the same or different at each location of the radical structure and is independently selected from the group consisting of a hydrogen atom, a halogen atom, an alkyl group including 1 to 10 carbon atoms, an aryl group including 5 to 20 carbon atoms, and an alkoxy group including 1 to 10 carbon atom.

3. The polymer of claim 2, wherein the polymer is formed by copolymerization of a first comonomer that includes a polymerizable carbon-carbon double bond and a pentaarylcyclopenta-1,3-dienyl radical and at least one second comonomer that includes a polymerizable carbon-carbon double bond.

4. The polymer of claim 3, wherein the first comonomer includes the structure of the formula I which forms a side group bonded to the polymer backbone, and the bonding group of one of the phenyl rings of the structure of the formula I comprises a vinyl group or a (meth)acryloyloxy group.

5. The polymer of claim 3, wherein the second comonomer includes a protic group.

6. The polymer of claim 3, wherein the second comonomer is selected from the group consisting of p-styrenesulfonic acid, (meth)acrylic acid, vinylpyridine and vinylpyrrolidone.

7. The polymer of claim 3, wherein the first comonomer and the second comonomer are contained in the polymer in a molar ratio of from 1:1 to 100:1.

8. The polymer of claim 1, wherein the polymer backbone comprises carbon atoms.

9. The polymer of claim 1, wherein the polymer is formed by copolymerization of at least two different comonomers such that the polymer comprises a first group and a second group, the first group including the structure of formula I which forms a side group bonded to the polymer backbone, the bonding of one of the phenyl rings of the structure of formula I comprises a vinyl group or a (meth)acryloyloxy group, and the second group comprises at least one protic group.

10. The polymer of claim 9, wherein the second group comprises one of p-styrenesulfonic acid, (meth)acrylic acid, vinylpyridine, and vinylpyrrolidone.

11. A resistive memory element comprising a memory cell that includes at least one actuatable first contact, one second contact and one storage medium arranged between the first contact and the second contact, wherein the storage medium is formed from the polymer of claim 1.

12. The resistive memory element of claim 11, wherein the first contact and the second contact comprise different materials.

13. The resistive memory element of claim 11, wherein each of the first contact and the second contact comprises a metal.

14. The resistive memory element of claim 11, further comprising a resistor with a constant resistance that is connected in series with the memory cell.

15. A memory field comprising at least two memory elements of claim 11 and a control device, wherein the memory field is configured for switching between two information states, and the control device is configured to control the information state of each memory element.

* * * * *